United States Patent [19]
Keeney

[11] Patent Number: 5,532,616
[45] Date of Patent: Jul. 2, 1996

[54] ON-CHIP SERIES TERMINATED CMOS(BI-CMOS) DRIVER

[75] Inventor: Stanley C. Keeney, Grand Saline, Tex.

[73] Assignee: Texas Instruments Incorporated, Dallas, Tex.

[21] Appl. No.: 283,436

[22] Filed: Aug. 1, 1994

[51] Int. Cl.⁶ .................................................. H03K 17/16
[52] U.S. Cl. .............................................. 326/30; 326/33
[58] Field of Search ........................................ 326/30, 33

[56] References Cited

U.S. PATENT DOCUMENTS

| | | | |
|---|---|---|---|
| 4,682,059 | 7/1987 | Garcia | 326/30 |
| 4,719,369 | 1/1988 | Asano | 326/30 |
| 4,947,061 | 8/1990 | Metz | 326/30 |
| 4,967,104 | 10/1990 | Ludwig | 326/30 |
| 5,095,231 | 3/1992 | Sartori | 326/30 |
| 5,254,883 | 10/1993 | Horowitz | 326/30 |
| 5,396,028 | 3/1995 | Tomassetti | 178/69 R |

*Primary Examiner*—Edward P. Westin
*Assistant Examiner*—Andrew Sanders
*Attorney, Agent, or Firm*—Thomas G. Eschweiler; James C. Kesterson; Richard L. Donaldson

[57] ABSTRACT

A terminated driver circuit 10 having a controlled output impedance includes an external impedance 12 connected to a bias generator circuit 20 which is operable to generate a plurality of bias voltages in response to a reference current generated by bias generator circuit 20 wherein the reference current magnitude is a function of external impedance 12. An output driver circuit 30 is connected to bias generator circuit 20. Output driver circuit 30 has a plurality of output devices connected to a transmission line and is operable to receive the plurality of bias voltages from bias generator circuit 20 and multiplex them such that only a single bias voltage is driving a single output device at a time. The plurality of bias voltages causes the plurality of output devices to have specific, controlled impedances when conducting wherein the controlled output impedances match the characteristic impedance of a transmission line 40 being driven by terminated driver circuit 10 thereby reducing waveform reflections.

11 Claims, 5 Drawing Sheets

5,532,616

ON-CHIP SERIES TERMINATED CMOS(BI-CMOS) DRIVER

FIELD OF THE INVENTION

This invention relates to electronic circuits and more particularly to terminated driver circuits.

BACKGROUND OF THE INVENTION

There is a need in both the telecommunications industry and the computer systems industry for output drivers to drive transmission lines. When driving transmission lines it is desirable for the output impedance of the driver to match the characteristic impedance of the transmission line as closely as possible in order to minimize reflections that cause ringing, overshoot, and undershoot at a receiver. Parallel terminated drivers such as ECL type or pseudo-ECL type drivers provide a controlled output impedance; however, they suffer from excessive power dissipation due to the substantial standby current in the parallel termination resistor. For this reason, series terminated drivers are favorable because the excessive power dissipation is eliminated. The series terminated driver is uniquely suited for low power, high frequency, point-to-point transmission.

In providing terminated drivers, the appropriate output impedance may be configured either "on-chip" or off-chip. Off-chip resistance solutions allow one to precisely configure the impedance, but forces one to allocate board space and requires discrete components which add costs. On-chip resistance solutions circumvent the off-chip solution problems. However, prior art on-chip solutions require a trimming process to ensure a precise impedance value because semiconductor processes cannot ensure high precision resistors. The trimming process is an extra step in manufacture and adds to the cost of manufacture.

It is an object of this invention to provide a method and circuit that provides a low power, point-to-point series terminated output driver with a controlled output impedance that can operate at high frequencies with no off-chip resistances and with no trimming process. Other objects and advantages of the invention will become apparent to those of ordinary skill in the art having reference to the following specification together with the drawings herein.

SUMMARY OF THE INVENTION

A terminated driver circuit 10 having a controlled output impedance includes an external impedance 12 connected to a bias generator circuit 20 which is operable to generate a plurality of bias voltages in response to a reference current generated by bias generator circuit 20 wherein the reference current magnitude is a function of external impedance 12. An output driver circuit 30 is connected to bias generator circuit 20. Output driver circuit 30 has a plurality of output devices connected to a transmission line and is operable to receive the plurality of bias voltages from bias generator circuit 20 and multiplex them such that only a single bias voltage is driving a single output device at a time. The plurality of bias voltages cause the plurality of output devices to have specific, controlled impedances when conducting wherein the controlled output impedances match the characteristic impedance of a transmission line 40 being driven by terminated driver circuit 10 thereby reducing waveform reflections.

DESCRIPTION OF THE PREFERRED EMBODIMENT

The problems of prior art series terminated drivers may be solved, according to one aspect of the invention, by controlling the gate-to-source voltages of push-pull output MOS transistors. Controlling the gate-to-source voltages set the effective impedance of the output to a proper level. The described embodiment of the invention works on the principle that when a terminated output driver drives a transmission line of the same impedance as the output impedance of the output driver, the voltage at the output of the driver switches to a level equal to ½(Vcc) and remains at that level until the reflection returns from the receiving end of the transmission line at which time the output rises to the full Vcc level or falls to ground depending upon whether the output driver is switching high or low. The receiving end of the transmission line will rise to the Vcc level or fall to ground level as soon as the initial waveform reaches that end of the line. Therefore, if the gate-to-source voltage of the MOS transistors in a push-pull output can be driven to a voltage that will cause them to have an output impedance equal to the transmission line impedance at a source-to-drain or drain-to-source voltage of ½(Vcc), then the active output device will have an effective impedance equal to that of the transmission line being driven to the reflected waveform.

Figure 1:
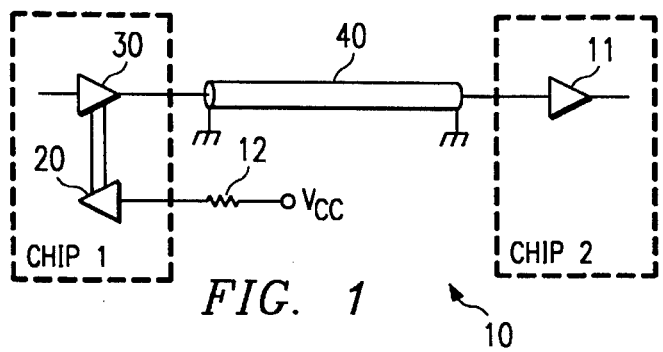
FIG. 1 is a block diagram illustrating a preferred embodiment of the invention, an on-chip series terminated driver circuit 10 in a multi-chip system.

FIG. 1 is a block diagram illustrating the preferred embodiment of the invention, an on-chip series terminated driver circuit 10 in a multi-chip system. The invention includes an output driver 30 with controlled output impedance 30 and a bias generator circuit 20 which generates bias voltages for output driver 30 based on the value of an off chip impedance 12. In this particular embodiment, impedance 12 is a resistor. However, impedance 12 could be any device that provides an impedance, such as a biased transistor. The controlled impedance output driver 30 has an output impedance equal to the characteristic impedance of the transmission line 40 and drives a receiver 11 located on chip 2. The bias generator circuit 20 generates proper gate-to-source bias voltages to set the impedance of output push-pull MOS transistors in the output buffer circuit 30. Output buffer circuit 30 receives the gate-to-source bias voltages, buffers them and multiplexes them such that only one of the gate-to-source bias voltages will exist at the push-pull output transistors at any one time. In that way the output will either source current from the output or sink current to the output. In no case will both transistors in the push-pull output try to conduct simultaneously.

Figure 2:
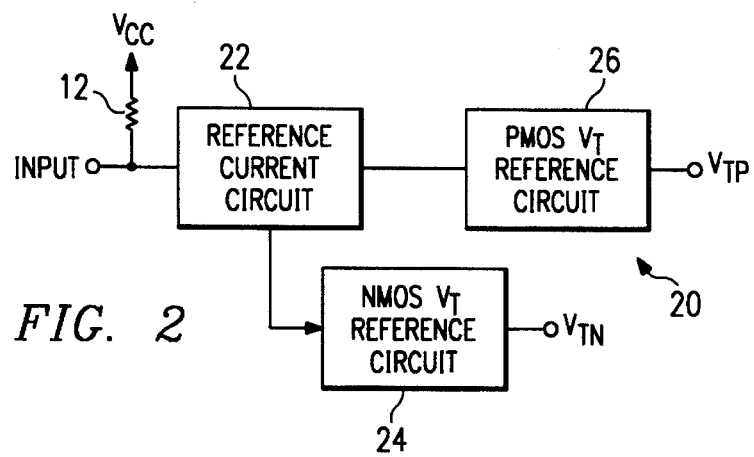
FIG. 2 is a block diagram illustrating an input circuit 20 of FIG. 1.

FIG. 2 is a block diagram illustrating components bias generator circuit 20. The input to bias generator circuit 20 is coupled to Vcc through off-chip impedance setting resistor 12 setting up a reference current in reference current circuit 22. A PMOS Vt reference circuit 26 and an NMOS Vt reference circuit 24 are both coupled to reference current circuit 22. PMOS Vt reference circuit 26 and NMOS Vt reference circuit 24 may be collectively referred to as a bias voltage reference circuit. Both PMOS Vt reference circuit 26 and NMOS Vt reference circuit 24 form outputs ($Vt_P$ and $Vt_N$) to output buffer circuit 30 of FIG. 1. Reference current circuit 22 creates a reference current for PMOS Vt reference circuit 26 and NMOS Vt reference circuit 24 which take the reference current and create gate-to-source voltages $Vt_P$ and $Vt_N$ for output buffer circuit 30 that will produce an output impedance that will match that of the transmission line that circuit 10 is driving.

Figure 3:
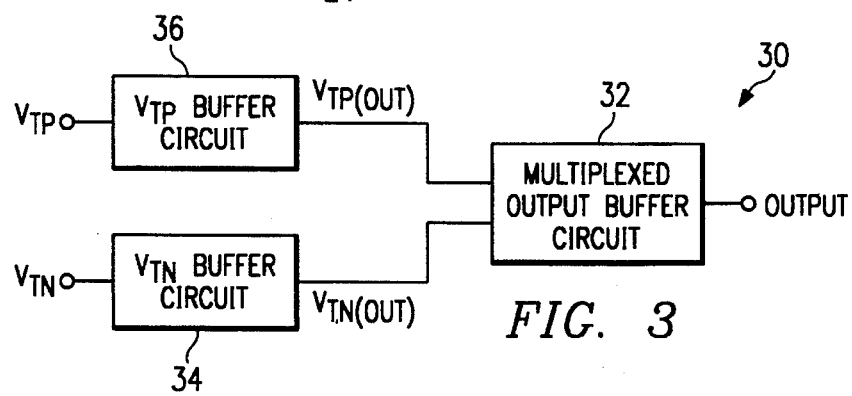
FIG. 3 is a block diagram illustrating an output buffer 30 of FIG. 1.

FIG. 3 is a block diagram illustrating components of output buffer circuit 30 of FIG. 1. Output buffer circuit 30 has a $Vt_P$ buffer circuit 36 having an input connected to the output of PMOS Vt reference circuit 26 of FIG. 2. A $Vt_N$ buffer circuit 34 has an input connected to the output of NMOS Vt reference circuit 24 of FIG. 2. Both $Vt_P$ buffer circuit 36 and $Vt_N$ buffer circuit 34 are coupled to a multiplexed output buffer circuit 32 which is coupled to the output of circuit 10 of FIG. 1. Circuit 30 receives gate-to-source voltages ($Vt_P$ and $Vt_N$) from bias generator circuit 20, buffers them to present a low output impedance to the heavy capacitive load of the large output transistor gates being switched and multiplexes them such that the appropriate output transistor gate is driven depending upon whether circuit 11 desires to sink or source current.

Figure 4:
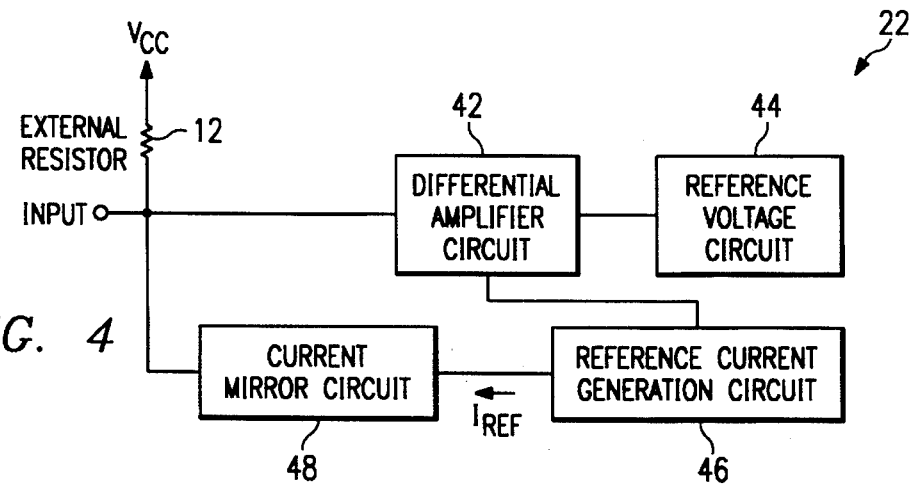
FIG. 4 is a block diagram illustrating a reference current circuit 22 of FIG. 2.

FIG. 4 is a block diagram of reference current circuit 22 of FIG. 2 Reference current circuit 22 includes a differential amplifier circuit 42 having a first input coupled to the circuit input of circuit 10 of FIG. 1 and a second input coupled to a reference voltage circuit 44. A reference current generation circuit 46 is also coupled to differential amplifier circuit 42 and a current mirror circuit 48 is coupled between the circuit input and the reference current generation circuit 46. An external resistor 12 is coupled between the circuit input and supply voltage Vcc. Reference current circuit 22 creates a reference current by generating a reference voltage with reference voltage circuit 44 at a first differential input to differential amplifier circuit 42. Differential amplifier circuit 42 compares the reference voltage to the voltage at the circuit input and creates a feedback signal to reference current generation circuit 46. The magnitude of current in reference current generation circuit 46 varies dependent on the feedback signal from differential amplifier circuit 42. Current mirror circuit 48 mirrors the current in reference current generation circuit 46 which impacts the voltage at circuit input by varying the current through external resistor 12. When differential amplifier circuit 42 is balanced a stable reference current $I_{REF}$ is established in reference current generation circuit 46.

Figure 5:
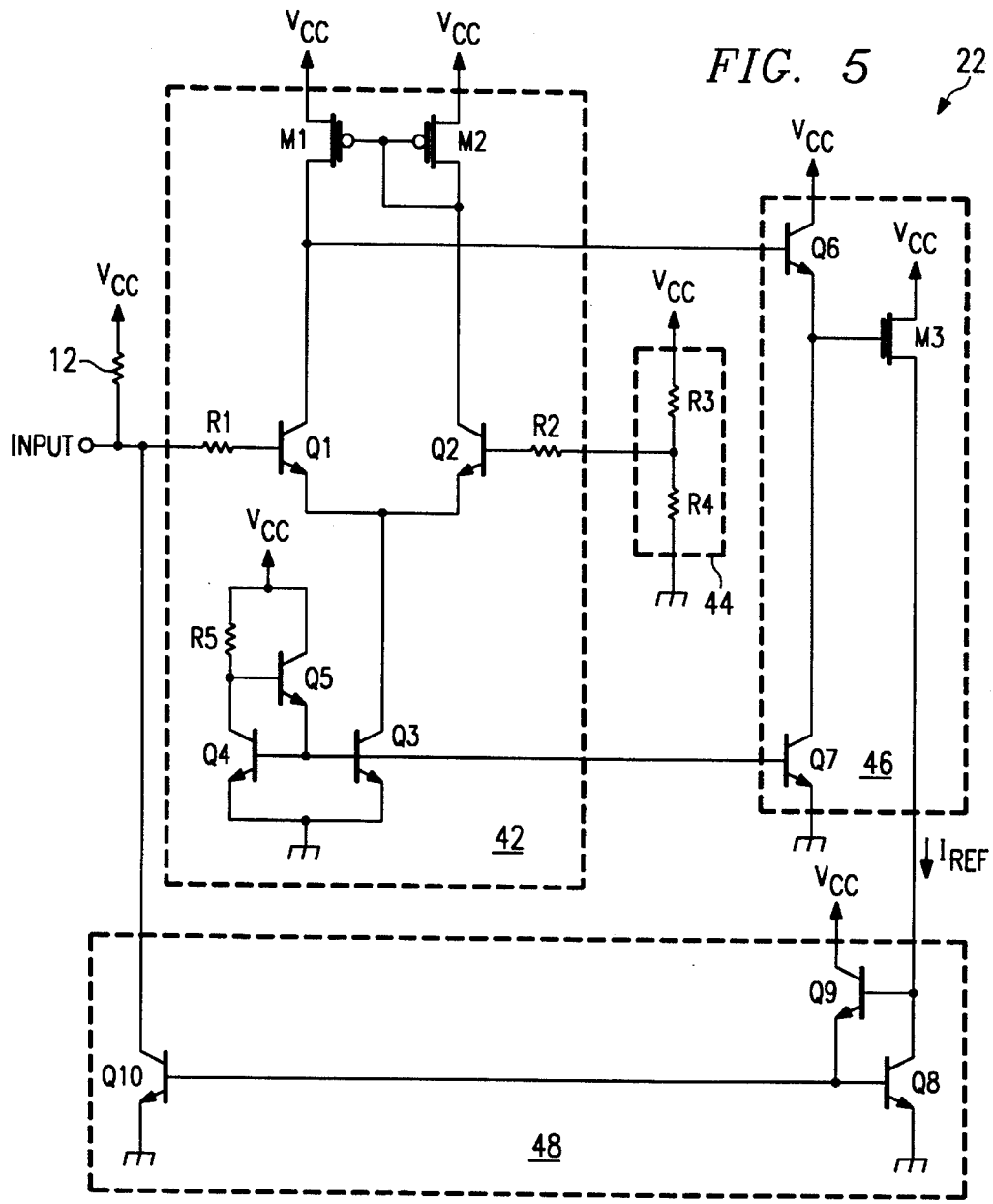
FIG. 5 is a schematic diagram illustrating reference current circuit 22.

FIG. 5 is a schematic diagram illustrating, in detail, reference current circuit 22 of FIG. 2 and FIG. 4. Differential amplifier circuit 42 includes a differential input pair Q1 and Q2 each having resistors R1 and R2 coupled to their bases. A current mirror consisting of transistors M1 and M2 are coupled to the collectors of Q1 and Q2. Q1 and Q2 have their emitters coupled together to the collector of Q3 which creates a stable current source for Q1 and Q2. The current through Q3 is dictated by a current mirror consisting of Q3, Q4, Q5 and R5. Q5 acts as a beta helper to reduce mirroring error. R5 establishes the magnitude of the reference current. Reference voltage circuit 44 includes resistor R3 and R4 coupled in series between Vcc and circuit ground. A precise reference voltage is established not by attempting to gauge the resistor's accuracy, but rather by establishing resistor size ratios and using standard voltage divider principles. Reference current generation circuit 46 includes transistor Q6 having its base coupled to the collector of Q1. The voltage across Q6 establishes the gate voltage of transistor M3. Transistor Q7 is coupled in series with Q6 and has its base connected to the base of Q3 and Q4 thus establishing a current mirror. Therefore the current in Q3 will be mirrored to Q7 and its magnitude will depend upon the transistor sizing of Q4 and Q7. M3's conduction is a function of its gate voltage. The drain of M3 carries the reference current $I_{REF}$ which feeds Q8 and forms the reference current for current mirror circuit 48. Transistors Q8, Q9 and Q10 form current mirror circuit 48. Q9 is a beta helper transistor that aids in reducing current mirror error. Q10 is connected to circuit input and external resistor 12. Therefore the current through resistor 12 is linked back through current mirror 48, reference current generation circuit 46 and differential amplifier circuit 42.

Figure 6:
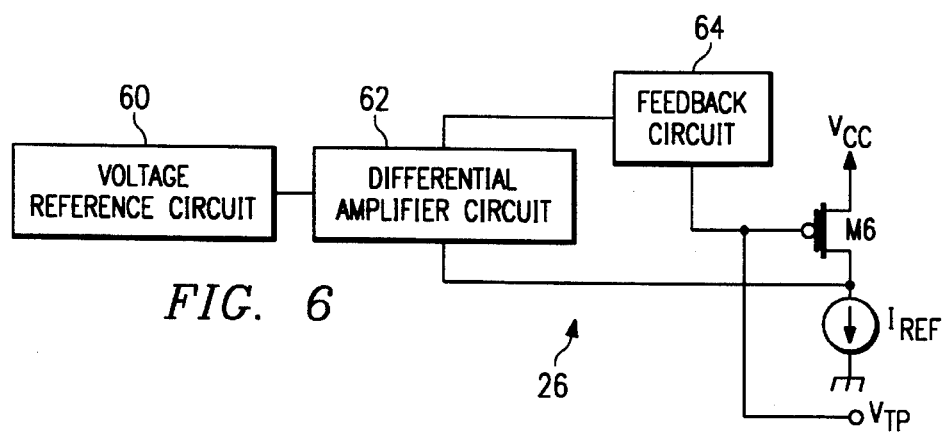
FIG. 6 is a block diagram illustrating a PMOS Vt reference circuit 26 of FIG. 2.

FIG. 6 is a block diagram illustrating PMOS Vt reference circuit 26 of FIG. 2. PMOS Vt reference circuit 26 has a voltage reference circuit 60 connected to a differential amplifier circuit 62. A feedback circuit 64 is connected to differential amplifier circuit 62 and a gate terminal of a transistor M6. Differential amplifier circuit 62 is also coupled to a drain terminal of M6. M6 has a source terminal connected to Vcc. M6 is coupled to reference current $I_{REF}$ of reference current circuit 22. Differential amplifier circuit 62 compares a reference voltage created by voltage reference circuit 60 to the drain voltage of M6. Feedback circuit 64 monitors the comparison of differential amplifier circuit 62 and modifies the gate voltage of M6 in response to the differential amplifier comparison. Modifying the gate voltage of M6 modifies its conduction and therefore its drain voltage. The modified gate voltage of M6 after differential amplifier circuit 62 is balanced is gate-to-source voltage $Vt_P$.

Figures 7, 8:
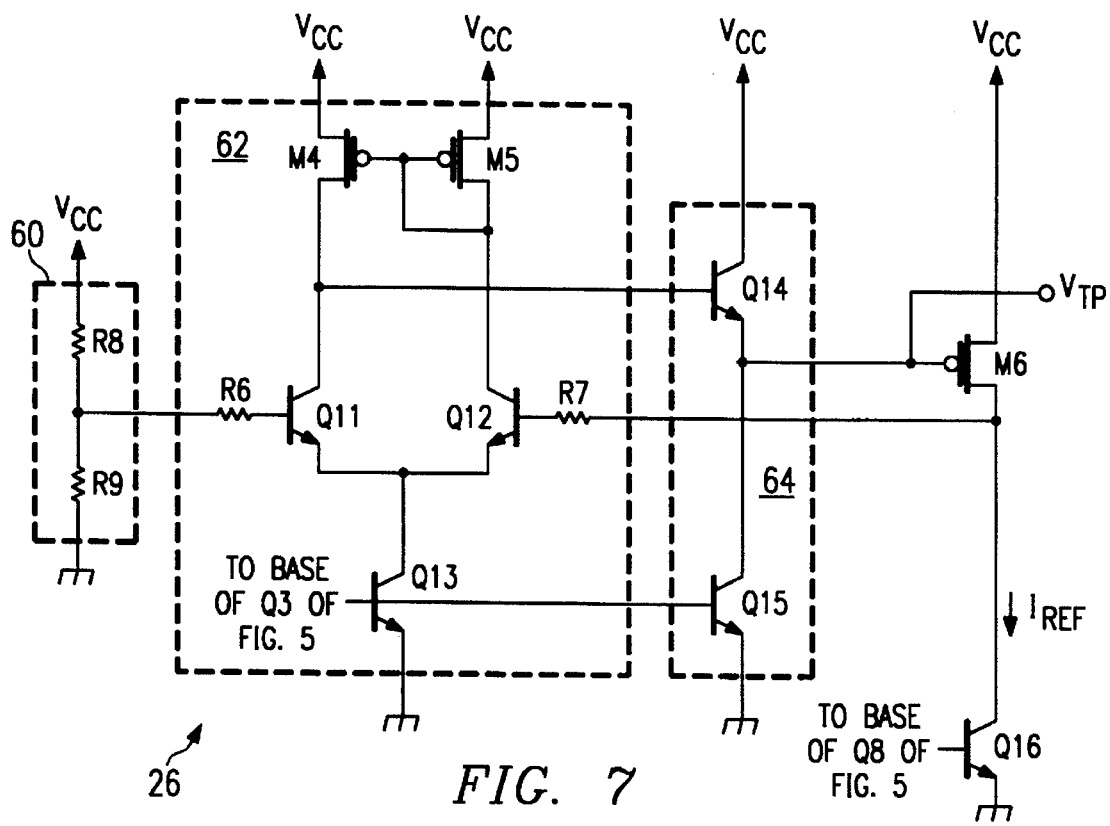
FIG. 7 is a schematic diagram illustrating PMOS Vt reference circuit 26.
FIG. 8 is a block diagram illustrating an NMOS Vt reference circuit 24 of FIG. 2.

FIG. 7 is a schematic diagram illustrating PMOS Vt reference circuit 26 of FIG. 2 and FIG. 6. Voltage reference circuit 60 includes resistors R8 and R9 coupled in series between Vcc and circuit ground. Differential amplifier circuit 62 includes a differential pair Q11 and Q12 coupled to a current mirror consisting of transistors M4 and M5. The base of transistors Q11 and Q12 are each coupled to a resistor R6 and R7 respectively. Differential pair transistors Q11 and Q12 are together coupled to transistor Q13 which acts as a current source. The base of Q13 is coupled to the base of Q3 of FIG. 5 The current through Q13 will be a function of the ratio of transistor sizing between Q4 and Q13 since Q3, Q4 and Q13 are coupled together through their bases. Feedback circuit 64 has a transistor Q14 coupled in series with a transistor Q15 between Vcc and circuit ground. Transistor Q14 has a base terminal connected to a collector terminal of Q11 and an emitter terminal connected to a gate terminal of a transistor M6. Transistor Q15 has a base connected to the base of Q13 and thereby forms a current mirror with Q13, Q3 and Q4 of FIG. 5. M6 sources reference current $I_{REF}$ through Q16 which forms a current mirror with Q8 of FIG. 5 which sinks reference current $I_{REF}$.

FIG. 8 is a block diagram illustrating NMOS Vt reference circuit 24 of FIG. 2. NMOS Vt reference circuit 24 includes a voltage reference circuit 50 coupled to a differential amplifier circuit 52. Differential amplifier circuit 52 is also connected to a feedback circuit 54. Both differential amplifier circuit 52 and feedback circuit 54 are coupled to a transistor M10. Differential amplifier circuit 52 is coupled to a drain terminal of M10 while feedback circuit 54 is coupled to a gate terminal of M10. Differential amplifier circuit 52 compares a reference voltage created by voltage reference circuit 50 to the drain voltage of M10. Feedback circuit 54 monitors the comparison of differential amplifier circuit 52 and modifies the gate voltage of M10 in response to the differential amplifier comparison. Modifying the gate voltage of M10 modifies its conduction and therefore its drain voltage. The modified gate voltage of M10 after differential amplifier circuit 52 is balanced is gate-to-source voltage $Vt_N$.

Figure 9:
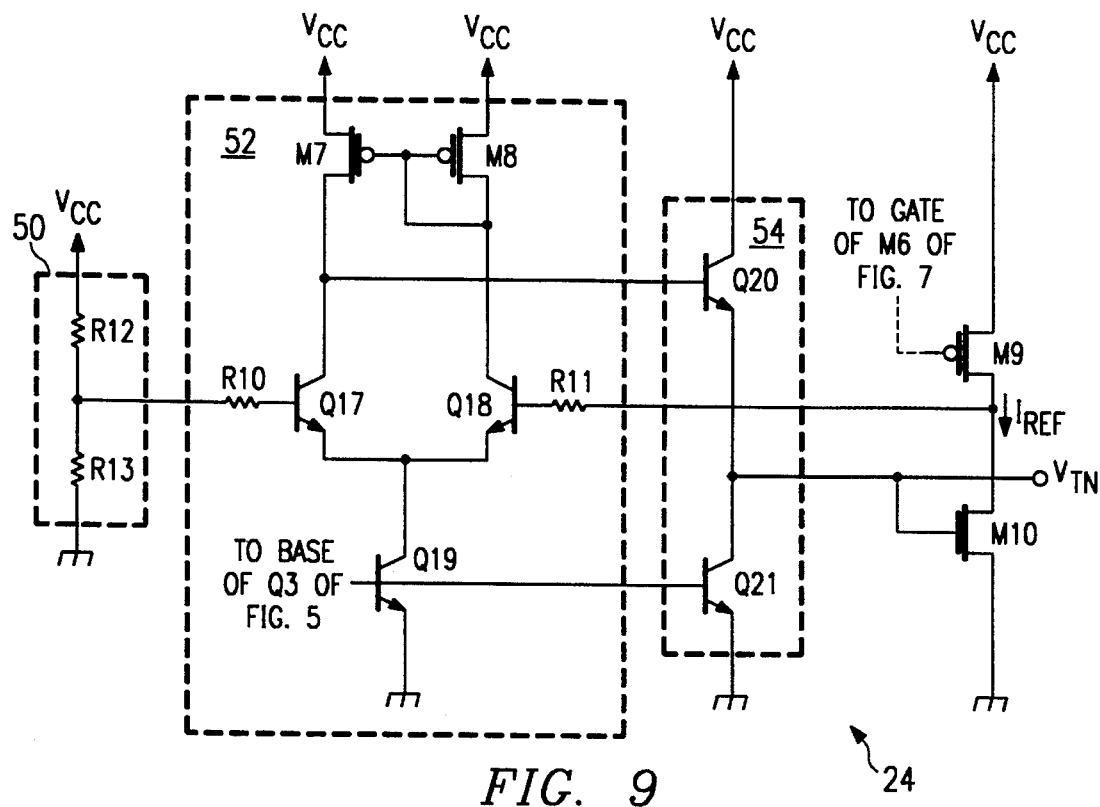
FIG. 9 is a schematic diagram illustrating NMOS Vt reference circuit 24.

FIG. 9 is a schematic diagram illustrating NMOS Vt reference circuit 24 of FIG. 2 and FIG. 8. Voltage reference circuit 50 includes resistors R12 and R13 coupled in series between Vcc and circuit ground. Differential amplifier circuit 52 includes a differential transistor pair Q17 and Q18. Q17 and Q18 are connected to a current mirror including transistors M7 and M8. Differential transistor pair Q17 and Q18 also each have a resistor R10 and R11 coupled to their base terminals respectively. Q17 and Q18 are also together coupled to a transistor Q19 that acts as a current source for differential amplifier circuit 52. Transistor Q19 has a base terminal connected to the base of Q3 and Q4 of FIG. 5 thereby forming a current mirror. Feedback circuit 54 includes transistors Q20 and Q21 coupled in series between Vcc and circuit ground. Transistor Q20 has a base terminal connected to a collector terminal of Q17 and an emitter terminal coupled to a gate of transistor M10. M10 is coupled in series with transistor M9 between Vcc and circuit ground. A gate terminal of transistor M9 is coupled to a gate terminal of M6 of FIG. 7 and the gate terminal of M10 forms the gate-to-source voltage output $Vt_N$.

Figure 10:
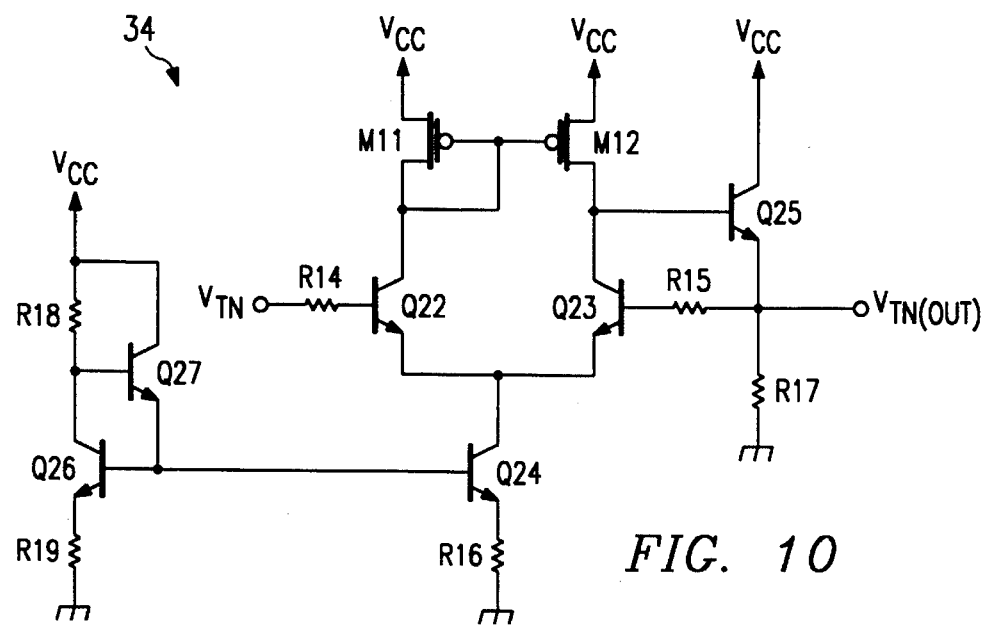
FIG. 10 is a schematic diagram illustrating a $Vt_N$ buffer circuit 34 of FIG. 3.

FIG. 10 is a schematic diagram illustrating $Vt_N$ buffer circuit 34 of FIG. 3. $Vt_N$ buffer circuit 34 includes a differential transistor pair Q22 and Q23 having resistors R14 and R15 coupled to their bases respectively. A current mirror including transistors M11 and M12 is coupled to differential transistor pair Q22 and Q23. Transistor pair Q22 and Q23 together are coupled to a transistor Q24 which acts as a current source for the transistor pair. Transistor Q24 is coupled in series with a resistor R16 between differential transistor pair Q22 and Q23 and circuit ground. Transistor Q24 is also coupled with a transistor Q26 and a transistor Q27 to form a current mirror. Transistor Q27 acts as a beta helper to aid in reducing mirroring error. A resistor R18 is coupled in series with transistor Q26 and a resistor R19 between Vcc and circuit ground. Resistor R18 and R19 set the magnitude of the current in transistor Q26. The current magnitude in Q24 is a function of the transistor sizing ratios of Q24 and Q26. A transistor Q25 has a base terminal coupled to a collector terminal of Q23. Transistor Q25 is coupled in series with a resistor R17 between Vcc and circuit ground. The junction between transistor Q25 and resistor R17 forms the output ($Vt_{N(OUT)}$) of $Vt_N$ buffer circuit 34 while the terminal of R14, not coupled to transistor Q22, forms the input of $Vt_N$ buffer circuit 34. The input of $Vt_N$ buffer circuit 34 is coupled to the output of NMOS Vt reference circuit 24 of FIG. 2, FIG. 8, and FIG. 9. $Vt_N$ buffer circuit 34 is an amplifier with a gain of "1" that buffers the gate-to-source voltage $Vt_N$ generated by NMOS Vt reference circuit 24. $Vt_N$ buffer circuit 34 provides increased current drive to output transistor M26 to increase the charging rate of a capacitance associated with output transistor M26 thereby increasing the frequency capabilities of output transistor M26.

Figure 11:
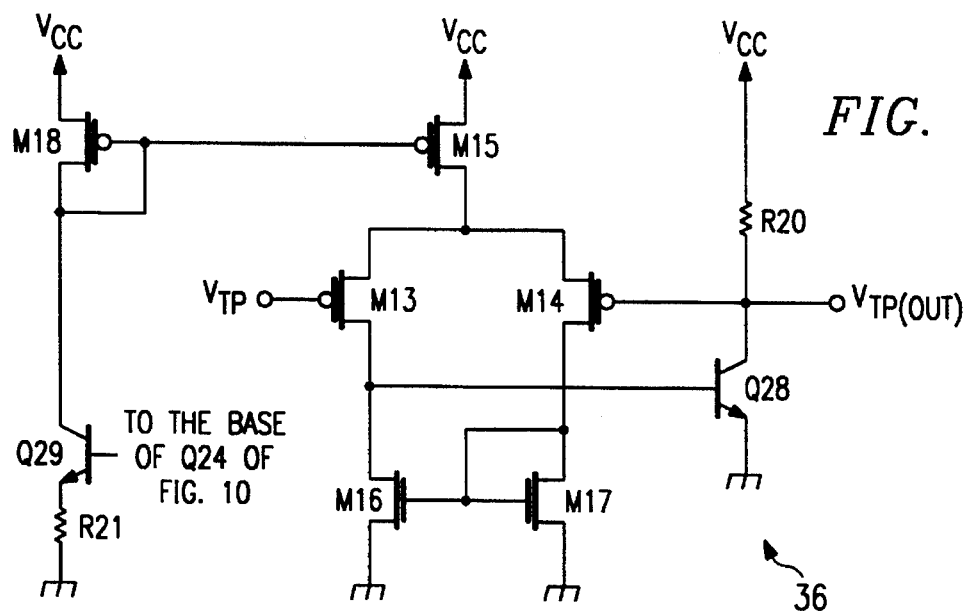
FIG. 11 is a schematic diagram illustrating a $Vt_P$ buffer circuit 36 of FIG. 3.

FIG. 11 is a schematic diagram illustrating $Vt_P$ buffer circuit 36 of FIG. 3. $Vt_P$ buffer circuit 36 includes a differential transistor pair M13 and M14 coupled to a current mirror composed of transistors M16 and M17. Differential transistor pair M13 and M14 are also together coupled to a transistor M15 that acts as a current source. Transistor M15 forms a current mirror with a transistor M18 that is coupled in series with a transistor Q29 and a resistor R21 between Vcc and circuit ground. Transistor Q29 forms a current mirror with Q24 of FIG. 10 and the current magnitude in Q29 is a function of the transistor sizing ratio between Q24 and Q29. A transistor Q28 has a base terminal coupled to a drain terminal of M16 and is in series with a resistor R20 between Vcc and circuit ground. The junction between R20 and Q28 is coupled to a gate terminal of M14 and forms the output ($Vt_{P(out)}$) of $Vt_P$ buffer circuit 36 while a gate terminal of M13 forms the input of $Vt_P$ buffer circuit 36. $Vt_P$ buffer circuit 36 is an amplifier with a gain of "1" that buffers the gate-to-source voltage $Vt_P$ generated by PMOS Vt reference circuit 26. $Vt_P$ buffer circuit 36 provides increased current drive to output transistor M25 to increase the charging rate of a capacitance associated with output transistor M25 thereby increasing the frequency capabilities of output transistor M25.

Figure 12:
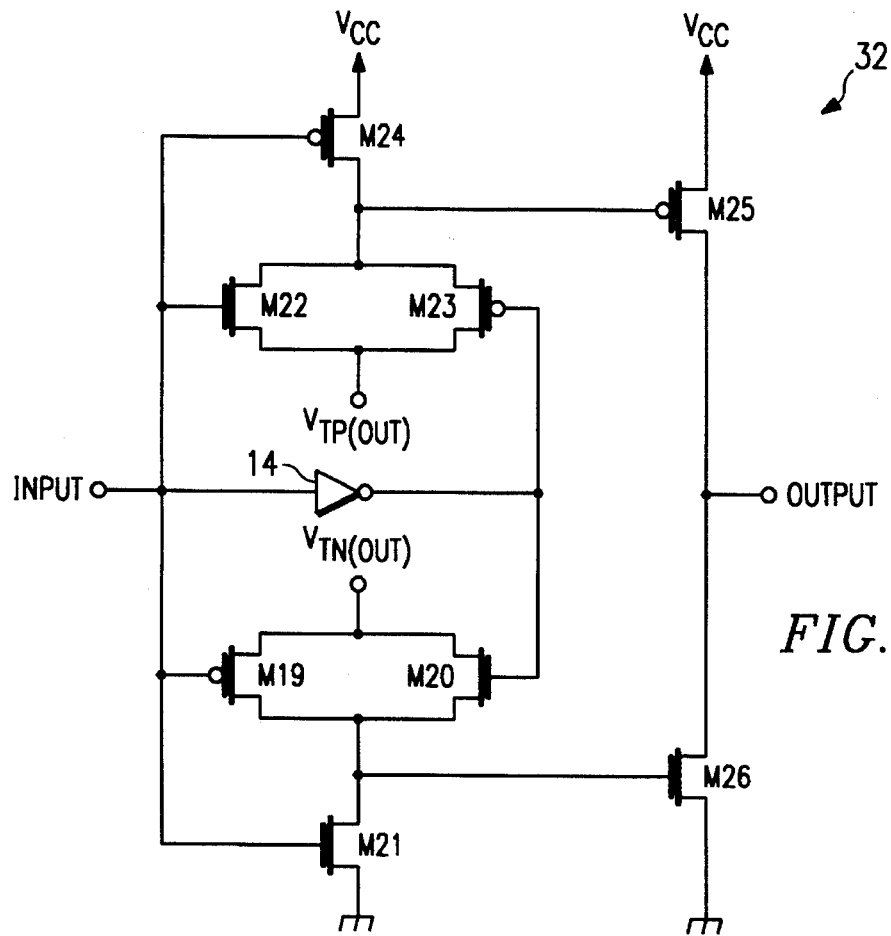
FIG. 12 is a schematic diagram illustrating a multiplexed output buffer circuit 32 of FIG. 3.

FIG. 12 is a schematic diagram illustrating multiplexed output buffer circuit 32 of FIG. 3. Multiplexed output buffer circuit 32 includes a transistor pair M19 and M20 coupled together in parallel to form a CMOS pass gate. M19 and M20 together are coupled to a transistor M21 and to a $Vt_{N(out)}$ input. $Vt_{N(out)}$ is the output of $Vt_N$ buffer circuit 34 of FIG. 3 and FIG. 10. Multiplexed output buffer circuit 32 includes a second transistor pair M22 and M23 coupled together in parallel to form a CMOS pass gate. M22 and M23 together are coupled to a transistor M24 and a $Vt_{P(out)}$ input. $Vt_{P(out)}$ is the output of $Vt_P$ buffer circuit 36 of FIG. 3 and FIG. 11. A transistor M25 is coupled in series with a transistor M26 between Vcc and circuit ground. The junction between M25 and M26 forms the output of multiplexed output buffer circuit 32 and circuit 10 of FIG. 1. M25 has a gate terminal coupled between M24 and pass gate made by M22 and M23. Transistor M26 has a gate terminal coupled between M21 and pass gate made by M19 and M20. An inverter 14 is coupled across transistors M22 and M23 and transistors M19 and M20. An input of inverter 14 forms the input of multiplexed output buffer circuit 32. The input to inverter 14 is supplied from core logic circuitry not shown and determines the output state of circuit 11. The input of multiplexed output buffer circuit 32 enables either the first pass gate (M19 and M20) or the second pass gate (M22 and M23) dependent upon whether the input is digitally high or low. Depending upon which pass gate is enabled, either $Vt_N$ or $Vt_P$ is passed to the gate terminals of output transistors M25 and M26 respectively which drive the output. Gate-to-source voltages ($Vt_N$ or $Vt_P$) are such that the output impedance of circuit 10 matches that of the transmission line it is driving thereby providing an effective series terminated driver on-chip without any trimming procedure required.

A functional description of the invention follows below. Each circuit schematic contained in the drawings will be described functionally as well as their functional interaction with the other circuitry in the invention. Although the invention is described with this specific circuitry implementation, it should be understood that other alternative circuits could be constructed to fulfill the same function. Alternative circuit that provide similar functionality fall within the scope of this invention.

With respect to FIG. 5, a reference voltage equal to ½(Vcc) is created by reference voltage circuit 44 consisting of R3 and R4. This is accomplished by sizing R3 and R4 identically. Therefore, using the voltage divider principle:

$$V(R4)=Vcc[R3/(R3+R4)],$$

and $$R3=R4,$$

therefore $$V(R4)=Vcc[R3/2R3],$$

$$V(R4)=½(Vcc).$$

Therefore the voltage across R4 is ½(Vcc). This voltage feeds a first differential input to differential amplifier circuit 42. Initially differential amplifier circuit 42 is unbalanced. If the voltage at the base of Q2 (approximately ½(Vcc)) is greater than the voltage at the base of Q1, Q2 will conduct more current than Q1. Since M1 and M2 are sized the same they will conduct the same current. Since M1 and M2 both are conducting equal amounts of current and Q1 and Q2 are not, the excess current from M1 drives the base of Q6, thus driving Q6 harder. Since Q6 is feeding Q7 which is coupled as a current mirror with Q3 and Q4, it does not want the extra current Q6 is supplying. This causes the gate capacitance of M3 to charge up. Since M3 is a PMOS transistor, when its gate voltage increases, it decreases its conduction. Since M3 feeds Q8, Q8's conduction also decreases which causes the current in Q10 (mirrored from Q8) to also decrease. Since Q10 draws its current from external resistor 12, the voltage across resistor 12 decreases causing the voltage at the base of Q1 to increase. This feedback process continues until the voltages at the base terminals of Q1 and Q2 are equal and therefore approximately ½(Vcc). Since R1 and R2 are sized the same, the voltage across external resistor 12 will be ½(Vcc).

If the voltage at the base of Q1 is greater than the base voltage of Q2, Q1 will want to conduct more current than Q2. Since M1 and M2 are sized equally they will supply the same amount of current. Therefore Q1 will try to pull current from the base of Q6 which will turn Q6 off. Since Q6 feeds Q7 and Q7 is mirrored with Q3 and Q4, Q7 will try to maintain its conduction by discharging the gate capacitance of M3. As the gate discharges, the gate voltage decreases thus increasing the conduction of M3 and thereby increasing reference current $I_{REF}$. Therefore the current in Q8 increases which is mirrored to Q10. As Q10 sinks more current the voltage across external resistor 12 increases thereby decreasing the voltage at the base of Q1. When differential amplifier circuit 42 becomes balanced the current in external resistor 12 is equal to the reference current $I_{REF}$ conducting through M3.

With respect to FIG. 7 PMOS Vt reference circuit 26 has voltage reference circuit 60 composed of R8 and R9 that creates a reference voltage of ½(Vcc) using voltage divider principles. The base of Q11 therefore has a voltage of approximately ½(Vcc). The base voltages of Q11 and Q12 are compared. If the base voltage of Q12 is greater than Q11 then Q12 will conduct more current than Q11. Since M4 and M5 are sized equally they will conduct the same current. Therefore the excess current in M4 will drive the base of Q14 causing it to be driven harder. Since Q14 sources current to Q15 which is maintaining an approximately constant current by mirroring with Q3 and Q13 the gate capacitance of M6 will charge up thereby increasing the voltage at the gate of M6. Since M6 is sinking $I_{REF}$ which is constant, M6 cannot conduct less current. Therefore the voltage across M6 changes due to the change of gate voltage. The drain voltage of M6 decreases (therefore the voltage across M6 increases) as its gate voltage increases. This continues until the base voltages of Q11 and Q12 are equal.

If the base voltage of Q11 is greater than Q12 then Q11 will conduct more current than Q12. Since M4 and M5 provide the same amount of current to Q11 and Q12, Q11 will attempt to pull current from the base of Q14. Attempting to pull current from Q14 will turn off Q14. Since Q14 sources current to Q15, Q15 will discharge the gate capacitance of M6. Since M6 conducts a constant current, $I_{REF}$, a decrease in gate voltage causes the drain of M6 to increase. Since the drain of M6 is coupled to the base of Q12 through R7 the base of Q12 will also increase. This continues until the base voltages of Q11 and Q12 are equal.

When the base voltages of Q11 and Q12 are the same, differential amplifier circuit 62 is balanced. Furthermore, the voltage at the drain of M6 is equal to the voltage across R9 which is ½(Vcc). Therefore PMOS Vt reference circuit 26 produces a gate voltage ($Vt_P$) at M6 that provides an output impedance calculated by $I_{REF}$ and the voltage across M6 (which is ½(Vcc)) and M6 will have an effective impedance equal to that of the external resistor 12.

With respect to FIG. 9 NMOS Vt reference circuit 24 has a voltage reference circuit 50 composed of resistors R12 and R13. The voltage across R13 is made to be ½(Vcc) by sizing R12 and R13 identically and using voltage divider principles. Differential amplifier circuit 52 compares the voltages at the bases of Q17 and Q18. If the base voltage at Q18 is larger than that of Q17, Q18 will conduct greater current. Since M7 and M8 are sized equally they will mirror the same current. Therefore the excess current from M7 will drive the base of Q20. Driving the base of Q20 makes Q20 conduct harder; however, Q20 is sourcing current to Q21 which is coupled to a current mirror through Q3 and Q19. It does not want the extra current, therefore Q20 charges up the gate capacitance of M10. Since M10 is conducting a constant current, $I_{REF}$, a change in M10's gate voltage results in a charge in its drain-to-source voltage, effectively decreasing it. Since the drain of M10 is coupled to the base of Q8 through R11 the base of Q18 decreases. This continues until the bases of Q17 and Q18 become equal.

If the base voltage of Q17 is greater then Q18 it will conduct more current than Q18. Since M7 and M8 conduct the same amount of current, Q17 will attempt to pull current from the base of Q20 thus shutting it off. Since Q21 is mirrored to Q3 and Q19 it will attempt to maintain its current conduction by discharging the gate capacitance of M10. Since M10 conducts a constant current, $I_{REF}$, a decrease in M10's gate voltage will increase M10's drain-to-source voltage. Since the drain of M10 is coupled to the base of Q18 through R11 the base of Q18 will also increase. This will continue until differential amplifier circuit 52 is balanced.

When differential amplifier circuit 52 becomes balanced M10 is conducting $I_{REF}$ and has a drain-to-source voltage of ½(Vcc). The gate voltage of M10 at this condition becomes the $Vt_N$ reference voltage. Therefore M10 will have an effective impedance equal to that of the external resistor 12.

With respect to FIG. 10 $Vt_N$ buffer circuit 34 receives the output of NMOS Vt reference circuit 24 ($Vt_N$) and coupled it to the base of Q22 through resistor R14. Q22 and Q23 operate as a differential amplifier similar to the ones described in FIG. 5, FIG. 7 and FIG. 9. Q22 and Q23 feed a current source composed of Q24 and R16 whose magnitude is dictated by a current mirror composed of Q24, Q26, Q27, R18 and R19. Q27 acts as a beta helper transistor to reduce mirroring error. If the base voltage of Q22 is larger than Q23 it will conduct more current. Since M11 and M12 are sized to provide equal amounts of current, the excess current from M12 will drive the base of Q25 thus causing Q25 to conduct harder. Since Q25 is driving a resistor R17, the voltage across R17 will increase. This will continue until the base voltages of Q22 and Q23 are equal. This results in the output of $Vt_N$ buffer circuit (the voltage across R17) to be the same voltage as its input, namely $Vt_N = Vt_{N(out)}$.

If the base voltage of Q23 is larger than Q22, Q23 will conduct greater current. Since M11 and M12 conduct equal amounts of current, Q23 will try to pull current out of the base of Q25 thus causing Q25 to shut off. As Q25 decreases its conduction, the voltage across R17 decreases. This continues until Q22 and Q23 become balanced. $Vt_N$ buffer circuit 34 exists because when the gate of output transistor M26 (in FIG. 12) is switched to $Vt_{N(out)}$ by the transmission gate comprised of M19 and M20 it presents a large capacitive load to the $Vt_{N(out)}$ node. At the instance of switching, a large current flows from $Vt_{N(out)}$ node through M19 and M20 and charges the gate capacitance of M26. This reduces the voltage at $Vt_{N(out)}$ node until the differential amplifier in $Vt_N$ buffer circuit 34 has time to recover. The output impedance of M26 will not be correct until $Vt_{N(out)}$ has recovered to the correct voltage. This must occur before the reflection returns from the receiving end of transmission line 40. It must also recover before M26 is called on to switch again. The maximum frequency capability is determined by how fast the $Vt_{N(out)}$ node can recover from a large current transient. $Vt_N$ buffer circuit 34 is necessary to lower the impedance at $Vt_{N(out)}$ node compared to the impedance at $Vt_N$ which is relatively high.

With respect to FIG. 11 $Vt_P$ buffer circuit 36 receives the output of PMOS Vt reference circuit 26 ($Vt_P$) and couples it to the gate of M13. M13 and M14 operate as a differential amplifier similar to the ones described in FIG. 5, FIG. 7, FIG. 9 and FIG. 10. M13 and M14 are sourced current by M15 which forms a current mirror with M18. M13 and M14 source current to a current mirror composed of M16 and M17. M16 and M17 are sized identically to sink the same amount of current. When the gate of M13 is less than the gate of M14, M13 will conduct a greater amount of current. Because M16 and M17 conduct the same amount of current, the excess current from M13 drives the base of Q28 causing it to conduct harder. Because Q28 sinks current from resistor R20, as the current through Q28 increases, the voltage across Q28 decreases. Since Q28 is connected to the gate of M14, the gate of M14 decreases. This will continue until the gate voltages of M13 and M14 become equal.

If the gate voltage of M13 is greater than the gate voltage of M14, M14 will conduct a greater amount of current. Because M16 and M17 conduct the same amount of current, M16 will try to pull current out of the base of Q28 which will cause Q28 to turn off. As Q28 begins to turn off, the current through R20 decreases, thereby increasing the voltage across Q28 which is also the gate voltage of M14. This continues until the gate voltages of M13 and M14 become equal. This results in the voltage across Q28 being equal to $Vt_P$ (therefore $Vt_P = Vt_{P(out)}$). $Vt_P$ buffer circuit 36 exists for the same reason as $Vt_N$ buffer circuit 34. At the instance of switching, a large current flows from $Vt_{P(out)}$ node through M22 and M23 and charges the gate capacitance of M25. This reduces the voltage at $Vt_{P(out)}$ node until the differential amplifier in $Vt_P$ buffer circuit 36 has time to recover. The output impedance of M25 will not be correct until $Vt_{P(out)}$ has recovered to the correct voltage. This must occur before the reflection returns from the receiving end of transmission line 40. It must also recover before M25 is called on to switch again. The maximum frequency capability is determined by how fast the $Vt_{P(out)}$ node can recover from a large current transient. $Vt_P$ buffer circuit 36 is necessary to lower the impedance at $Vt_{P(out)}$ node compared to the impedance at $Vt_P$ which is relatively high.

With respect to FIG. 12, multiplexed output buffer circuit 32 receives three input signals; a digital signal at its input and $Vt_{P(out)}$ (from $Vt_P$ buffer circuit 36, and $Vt_{N(out)}$ from $Vt_N$ buffer circuit 34. The digital signal at the input of multiplexed output buffer circuit 32 dictates which output transistor (M25 or M26) will be driven. When the circuit input is at a high digital value, transistors M22 and M23 are turned on and transistors M19 and M20 are turned off. Furthermore M24 will be off and M21 will be on. This pulls the gate of M26 to ground thus ensuring no conduction in M26 and allows the gate of M25 to receive the gate voltage $Vt_{P(out)}$ which is passed through the pass gate composed of M22 and M23.

When the input to multiplexed output buffer circuit 32 is at a low digital value, transistors M22 and M23 are turned off and transistors M19 and M20 are turned on. Furthermore M24 is turned on and M21 is turned off. When M24 turns on it pulls the gate of M25 up to Vcc thus ensuring that M25 will not conduct. When M21 is off it allows the gate of M26 to attain the gate voltage of $Vt_{N(out)}$ which is passed through the pass gate composed of M19 and M20.

The impedance of M10 of FIG. 9 is equal to that of external resistor 12. The impedance of M26 is equal to that of M10 (of FIG. 9) if M10 and M26 are identically sized. M10 has its source connected to ½(Vcc) and its drain connected to ground so it has ½(Vcc) impressed across it from source to drain. The resistor 12 also has ½(Vcc) impressed across it. The gate voltage of M10 has been adjusted to cause the same current to flow from source to drain as the current in resistor 12 when ½(Vcc) is impressed across them. Therefore the apparent impedance of M10 is the same as that of resistor 12 with ½(Vcc) impressed across both. M26 has the same gate to source voltage as M10 and the same $V_{DS}$ when the output voltage is ½(Vcc).

For an ideal MOS device with no short channel effects the linear drain current equation is:

$$I_{DS} = K_P(W_{eff}/L_{eff})[2(V_{GS}-Vt)V_{DS} - V_{DS}^2].$$

For M10 and M26 all parameters are the same except $W_{eff}$. Therefore:

$$I_{DS}(M10)/I_{DS}(M26) = W_{eff}(M10)/W_{eff}(M26).$$

If $W_{eff}(M26) = 20 \times W_{eff}(M10)$, then if both devices have the same $L_{eff}$, $K_P$, $V_{GS}$, Vt and $V_{DS}$, M26 will have 20X the current in M10. Since Z=V/I, the impedance of M26 is equal to the impedance of M10 divided by 20. Therefore the impedance of M10 is 20X larger than the impedance of M26. This allows control of low values of output impedance requiting very large output devices with smaller devices in bias generator circuit 20. It also allows the value of resistor 12 to be higher than the output impedance by orders of magnitude which reduces the current and therefore the power in bias generator circuit 20.

$$\text{Resistor } 12 = W_{eff}(M26)/W_{eff}(M10) \times \text{Line impedance}.$$

Therefore M26 provides a series terminated output that has the same impedance as the transmission line its driving with only a single external resistor (resistor 12). No internal resistor trimming is required.

The output impedance of series terminated driver 10 must be equal or nearly equal to the characteristic impedance of the transmission line for a good waveform at the receiving end without ringing or overshoot. The value of resistor 12 is some ratio of the width of M10 (of FIG. 9) to the width of M26 (of FIG. 12) and the width of M6 (of FIG. 6) to the width of M25 (of FIG. 12). For example, if the circuit is to drive a 50 ohm transmission line and resistor 12 is desired to be at least 1 Kohm to keep the power dissipation low, then the ratio of resistor 12 to the transmission line impedance would be:

$$(\text{Resistor } 12)/Z_0 = 1000/50 = 20.$$

If external resistor 12 is 1000 ohms and M10 is 75 um×0.8 um and M25 is 1500 um×0.8 um, then the length of M25 is 20X longer than M10. Therefore the effective impedance of M25 is 50 ohms. Again, this scaling capability allows the current in the reference circuit 22, 24 and 26 to be much lower than that in the output device and would therefore substantially decrease power dissipation and die size.

Although the invention has been described with reference to the preferred embodiment herein, this description is not to be construed in a limiting sense. Various modifications of the disclosed embodiment as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A terminated driver circuit, comprising:

an external impedance;

a bias generator circuit connected to the external impedance, said bias generator circuit generating a plurality of bias voltages in response to a reference current, said reference current being a function of the external impedance magnitude; and an output driver circuit connected to said bias generator circuit, said output driver circuit having a plurality of output devices connected to a transmission line, said driver circuit receiving said plurality of bias voltages from said bias generator circuit and selectively coupling them to the plurality of output devices such that only a single bias voltage is driving a single output device at a time, wherein said plurality of bias voltages causes the plurality of output devices to have a specific output impedance that is matched with the characteristic impedance of said transmission line thereby reducing waveform reflections.

2. A terminated driver circuit, comprising:

an external impedance;

a bias generator circuit connected to the external impedance, said bias generator circuit generating a plurality of bias voltages in response to a reference current, said reference current being a function of the external impedance magnitude, wherein said bias generator circuit further comprises:

a reference current circuit connected to the external impedance, wherein the reference current circuit compares an internal reference voltage to a voltage which exists across the external impedance and provides feedback to the external impedance in response to the comparison by adjusting a current sourced through the external impedance and thereby stabilizing the current magnitude of the current sourced through the external impedance when the internal reference voltage is equal to the voltage across the external impedance, wherein a reference current is created that is a ratio of the current magnitude sourced through the external impedance; and a bias voltage reference circuit connected to the reference current circuit, wherein the bias voltage reference circuit takes said reference current from said reference current circuit and sources said reference current through a transistor thereby creating a second voltage which is compared to a second reference voltage, and wherein feedback is supplied as a voltage to a control terminal of said transistor thereby adjusting the second voltage until said second voltage is equal to said second reference voltage, whereby the voltage at said control terminal of the transistor is said bias voltage for said bias voltage reference circuit; and an output driver circuit connected to said bias generator circuit, said output driver circuit having a plurality of output devices connected to a transmission line, said driver circuit receiving said plurality of bias voltages from said bias generator circuit and selectively coupling them to the plurality of output devices such that only a single bias voltage is driving a single output device at a time, wherein said plurality of bias voltages causes the plurality of output devices to have a specific output impedance that is matched with the characteristic impedance of said transmission line thereby reducing waveform reflections.

3. The terminated driver circuit of claim 2, wherein said reference current circuit further comprises:

a differential amplifier circuit having a first differential input coupled to said external impedance;

a reference voltage circuit connected to a second differential input of said differential amplifier circuit;

a reference current generation circuit connected to said differential amplifier circuit;

a current mirror circuit connected to said reference current generation circuit and said external impedance; and wherein the differential amplifier circuit compares voltage values at said first and second differential inputs and said reference current generation circuit creates a reference current in response to the comparison and wherein the current mirror circuit sinks a second current from the external impedance that is a ratio of said reference current thereby adjusting the voltage value at the first differential input and wherein the voltage value at the first differential input continues to be adjusted until the voltage values at the first and second differential inputs are equal at which time the reference current generated by said reference current generation circuit has stabilized.

4. The terminated driver circuit of claim 2, wherein said bias voltage reference circuit further comprises:

a differential amplifier circuit having first and second differential inputs;

a reference voltage circuit connected to said first differential input of said differential amplifier circuit;

said transistor being connected to said second differential input of said differential amplifier circuit, wherein said transistor conducts said reference current and the voltage across said transistor is sensed at said second differential input;

a feedback circuit connected to said differential amplifier circuit and said control terminal of the transistor; and wherein said differential amplifier circuit compares the voltage values at said first and second differential inputs and said feedback circuit adjusts the voltage at said control terminal of said transistor in response to the comparison thereby adjusting the voltage value at said second differential input until the voltage values at said first and second differential inputs are equal and wherein the voltage at the control terminal of said transistor forms the bias voltage.

5. The terminated driver circuit of claim 2, wherein said output driver circuit further comprises:

a multiplexer connected to a logic circuit and said bias generator circuit that determines whether an output of said output driver circuit is sourcing or sinking current, wherein the multiplexer passes a single designated bias voltage to a control terminal of a specified output device in response to said logic circuit; and a plurality of output devices connected to said multiplexer and said transmission line, wherein when said multiplexer passes the single designated bias voltage to the control terminal of the specified output device of said plurality of output devices and said specified output device conducts in such a manner as to have an output impedance equal to the characteristic impedance of said transmission line.

6. The terminated driver circuit of claim 5, wherein said output driver circuit further comprises a buffer circuit connected between said bias generator circuit and said multiplexer, wherein said buffer circuit provides increased current drive through said mulitplexer to each of said plurality of output devices to increase the charging rate of a capacitance associated with said plurality of output devices thereby increasing the frequency capabilities of the plurality of output devices.

7. The terminated driver circuit of claim 5, wherein said multiplexer further comprises:

a first plurality of pass gates, wherein said first plurality of pass gates is coupled to a first portion of said plurality of bias voltages and a plurality of pull-up transistors and sourcing drive transistors, wherein, when said first plurality of pass gates are conducting, said first portion of said plurality of bias voltages to control terminals of said sourcing transistors, said sourcing transistors are caused to source current to said transmission line, further said sourcing transistors having output impedances equal to the characteristic impedance of said transmission line, and wherein, when said first plurality of pass gates are not conducting, said plurality of pull-up transistors pull the control voltages of said sourcing transistors high, thereby turning said sourcing transistors off; and a second plurality of pass gates, wherein said second plurality of pass gates are coupled to a second portion of said plurality of bias voltages and a plurality of pull-down transistors and sinking drive transistors, wherein, when said second plurality of pass gates are conducting, said second portion of said plurality of bias voltages to control terminals of said sinking transistors said sinking transistors are caused to sink current from said transmission line, said sinking transistors having output impedances equal to the characteristic impedance of said transmission line and wherein, when said second plurality of pass gates are not conducting, said plurality of pull-down transistors pull the control voltages of said sinking transistors low, thereby turning said sinking transistors off.

8. A method of controlling a circuit output impedance, comprising the steps of:

establishing a reference current through a known impedance;

generating a fixed voltage in response to said reference current;

impressing a voltage substantially equal to said fixed voltage across a transistor having substantially similar operating characteristics as an output device;

biasing said transistor to conduct a ratio of said reference current, thereby creating a bias voltage; and transmitting the bias voltage to a control terminal of the output device, whereby said output device, when driving a load, exhibits a controlled output impedance.

9. The method of claim 8 wherein the step of establishing a reference current further comprises the steps of:

comparing a reference voltage to a voltage drop across said known impedance;

adjusting a first current through said known impedance in response to said comparison such that said reference voltage and said voltage drop across said known impedance are equal; and mirroring said reference current from said first current through said known impedance such that said reference current is a ratio of the current through the known impedance.

10. The method of claim 8 wherein the step of generating a fixed voltage comprises the steps of:

identifying a voltage magnitude that exists at said output device when said output device has an output impedance that is matched to a characteristic impedance of a transmission line said output device is driving; and creating said voltage magnitude as a reference voltage by establishing a voltage divider resistor network.

11. The method of claim 8, wherein the load is a transmission line.

* * * * *